United States Patent

Ohnuma

[11] Patent Number: 6,144,760
[45] Date of Patent: *Nov. 7, 2000

[54] EXPOSURE DATA CORRECTION METHOD, EXPOSING METHOD, PHOTOMASK, SEMICONDUCTOR DEVICE, EXPOSURE DATA CORRECTION APPARATUS, EXPOSURE APPARATUS, AND MANUFACTURING APPARATUS OF SEMICONDUCTOR DEVICE

[75] Inventor: Hidetoshi Ohnuma, Kanagawa, Japan

[73] Assignee: Sony Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/972,050

[22] Filed: Nov. 17, 1997

[30] Foreign Application Priority Data

Nov. 22, 1996 [JP] Japan ................................ 8-311609

[51] Int. Cl.[7] .................................................... G06K 9/00
[52] U.S. Cl. ............................................................ 382/144
[58] Field of Search ..................... 250/492.2; 364/474.02, 364/491, 525; 356/404, 400; 382/144, 145, 148, 149; 395/500.22

[56] References Cited

U.S. PATENT DOCUMENTS

| | | | |
|---|---|---|---|
| 5,051,598 | 9/1991 | Ashton et al. | 250/492.2 |
| 5,305,225 | 4/1994 | Yamaguchi et al. | 364/474.02 |
| 5,377,340 | 12/1994 | Seroussi et al. | 395/400 |
| 5,553,273 | 9/1996 | Liebmann | 395/500 |
| 5,754,443 | 5/1998 | Manabe | 364/491 |

OTHER PUBLICATIONS

European Search Report dated Nov. 4, 1999.

*Primary Examiner*—Jose L. Couso
*Assistant Examiner*—Shawn Cage
*Attorney, Agent, or Firm*—Ronald F. Kananen; Rader, Fishman & Grauer

[57] ABSTRACT

An initial hash database is generated by giving hash indices to drawing data of drawing patterns that are obtained by performing calculation processing on exposure data relating to layout-designed exposure data. Then, drawing data of a target drawing pattern is extracted by searching the hash database, and the extracted drawing data is subjected to a proximity effect correction. Then, a new hash database is generated by giving hash indices to the corrected drawing data. As a result, the data retrieval time is greatly shortened and the amount of corrected data is reduced.

8 Claims, 6 Drawing Sheets

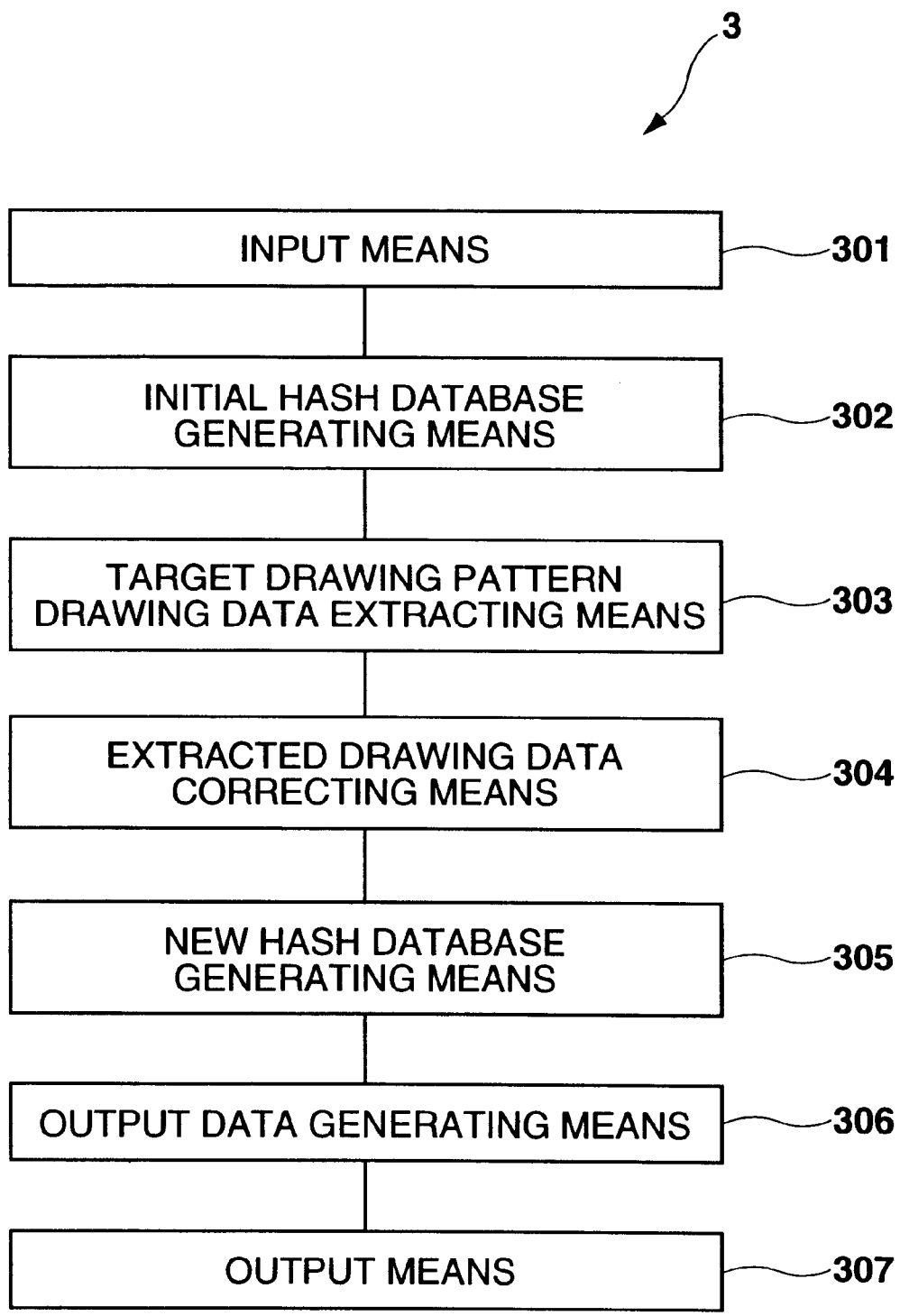

EXPOSURE DATA CORRECTION METHOD, EXPOSING METHOD, PHOTOMASK, SEMICONDUCTOR DEVICE, EXPOSURE DATA CORRECTION APPARATUS, EXPOSURE APPARATUS, AND MANUFACTURING APPARATUS OF SEMICONDUCTOR DEVICE

BACKGROUND OF THE INVENTION

The present invention relates to a method for correcting exposure patterns to correct for the proximity effect in exposure in a lithography process of semiconductor device manufacture, as well as to an exposing method, a photomask, a semiconductor device, an exposure data correction apparatus, an exposure apparatus, and a semiconductor device manufacturing apparatus using the above correction method.

At present, device structures are increasingly miniaturized with increases in the degree of integration and functionality and, as a result, pattern deformation due to the proximity effect in exposure is problematic in lithography steps of device manufacturing processes. For example, where light is used as exposure energy beams, if the device design rule is at such a level that the line width is close to the exposure wavelength, the interference effect of exposure light becomes remarkable, resulting in differences between design patterns and transferred resist patterns.

The proximity effect takes form, for instance, as dimensional differences between isolated patterns and line/space patterns and contraction at pattern end portions. In particular, the proximity effect tends to occur more likely in repetitive memory cells which are required to have a high degree of integration. In devices of the 0.35-$\mu$m generation onward, the proximity effect takes form as width variations of isolated lines and contraction of line end portions not only in repetitive memory cell regions as mentioned above but also peripheral circuit regions of memories and one-chip random circuit regions of ASIC-type devices, which causes deterioration of the line width controllability in devices and decreases of alignment margins in processes. As a result, variations of the device characteristics increase, ending up with a reduction in chip yield. In this manner, the proximity effect very adversely affects the efficiency of manufacture.

The above-mentioned pattern distortion due to the proximity effect is now prevented in the following manner. Where light is used as the energy beams, the shapes of photomask patterns, i.e., the shapes of drawing patterns for forming the photomask, are corrected. Where an electron beam is used as the energy beam, the shapes of drawing patterns and the irradiation amount (exposure amount) of the electron beam are corrected. For example, the above correction is performed in converting layout-designed exposure patterns (hereinafter referred to as "design patterns") into mask patterns through pattern calculation processing.

Further, for memory cells of the 0.35-$\mu$m generation onward, automatic optical proximity effect correction (OPC) systems have been developed that are based on light intensity simulation. The processing time of the proximity effect correction by such automatic OPC systems is tens of seconds in the case of correction for a several-micrometer-square cell. However, if such a system itself is used for proximity effect correction of a chip-scale ransom pattern, it will take hundreds of days.

In view of the above, there have been proposed, as methods for enabling chip-level proximity effect correction, rule-based methods that perform correction processing only on certain limited pattern shapes according to preset rules.

However, the above correction methods have the following problems because they correct design patterns.

That is, having a hierarchical structure, design patterns are complex in data structure. Further, to correct design patterns, they need to be subjected to pattern calculation processing in advance. To this end, pattern data needs to be developed. Therefore, not only does the data size become enormous but also the process itself becomes complex. Thus, even the rule-based methods cannot shorten the entire processing time to a practical level.

From the viewpoint of processing time, conventional manufacturing processes of a semiconductor device employ the above correction process that provides partial design patterns. Therefore, when design patterns of one chip are completed, the design patterns have already been corrected. Circuit simulation is performed on the corrected design patterns. Since the corrected design patterns are different from patterns to be formed on a wafer, results of the circuit simulation should be low in reliability.

SUMMARY OF THE INVENTION

An object of the present invention is to decrease the processing time of a proximity effect correction on exposure data.

Another object of the invention is to improve the reliability of a circuit simulation that is performed on layout-designed exposure patterns.

According to the invention, exposure data relating to layout-designed exposure patterns are corrected based on drawing data of drawing patterns that are obtained by performing calculation processing on the exposure data. This is done by generating an initial hash database by giving hash indices to the drawing data, correcting drawing data that is extracted by searching the initial hash database, and generating a new hash database based on the corrected drawing data.

In the above correction method, the initial hash database may be generated by dividing a drawing region in mesh form so that the area of each of mesh regions corresponds to a scattering range of an energy beam that is used in the exposure, and giving hash indices to drawing data of drawing patterns that are located in each of the mesh regions. In this case, it is judged whether another drawing pattern exists inside a central mesh region where the target drawing pattern is located or surrounding mesh regions that surround the central mesh region. A mutual proximity effect correction is performed on the drawing data of the target drawing pattern if there exists another drawing pattern, and a self proximity effect correction is performed on the drawing data of the target drawing pattern if there does not exist any other drawing pattern.

Where the drawing data correction is performed on a drawing pattern for direct drawing exposure of the exposure patterns, the drawing data is at least one of shape data of the drawing pattern and exposure amount data in the exposure. Where the drawing data correction is performed on a drawing pattern for formation of a photomask for forming the exposure patterns, the drawing data is shape data of a drawing pattern for formation of the photomask.

A first exposing method according to the invention is a method for performing drawing exposure performed by using drawing data that have been corrected by the above exposure data correction method. A second exposing method according to the invention is a method for performing exposure by using a photomask having patterns that have been formed by drawing exposure using drawing data that have been corrected by the above exposure data correction method.

A photomask according to the invention has patterns that have been formed by drawing exposure using drawing data that have been corrected by the above exposure data correction method.

A semiconductor device according to the invention is manufactured through lithography processing by using a photomask having patterns that have been formed by drawing exposure using drawing data that have been corrected by the above exposure data correction method.

An exposure data correction apparatus according to the invention comprises means for generating an initial hash database by giving hash indices to drawing data of drawing patterns that are obtained by performing calculation processing on exposure data relating to layout-designed exposure patterns; means for extracting drawing data of a target drawing pattern by searching the initial hash database; means for correcting the drawing data of the target drawing pattern to prevent a proximity effect in exposure; and means for generating a new hash database by giving hash indices to the corrected drawing data.

The initial hash database generating means may comprise means for dividing a drawing region in mesh form so that the area of each of mesh regions corresponds to a scattering range of an energy beam that is used in the exposure; and means for generating the initial hash database by giving hash indices to drawing data of drawing patterns that are located in each of the mesh regions. The drawing data correcting means may comprise means for judging whether another drawing pattern exists inside a central mesh region where the target mesh region is located or surrounding mesh regions that surround the central mesh region; means for performing a mutual proximity effect correction on the drawing data of the target drawing pattern if there exists another drawing pattern; and means for performing a self proximity effect correction on the drawing data of the target drawing pattern if there does not exist any other drawing pattern.

Where the drawing data correction is performed on a drawing pattern for direct drawing exposure of the exposure patterns, the drawing data is at least one of shape data of the drawing pattern and exposure amount data in the exposure. Where the drawing data correction is performed on a drawing pattern for formation of a photomask for forming the exposure patterns, the drawing data is shape data of a drawing pattern for formation of the photomask.

An exposure apparatus according to the invention comprises the above exposure data correction apparatus; and exposing means for performing drawing exposure by using drawing data that have been corrected by the correction apparatus.

A manufacturing apparatus of a semiconductor device according to the invention comprises the above exposure data correction apparatus; and exposing means for performing exposure by using a photomask that has been formed by drawing exposure using drawing data that have been corrected by the correction apparatus.

According to the invention, drawing data of a target drawing pattern can be retrieved and corrected at high speed by generating an initial hash database by giving hash indices to drawing data, and then correcting drawing data that is extracted by searching the initial hash database. Since a new hash database is generated based on corrected drawing data, corrected exposure data have a reduced data amount. Further, since the above correction is performed on drawing data, it is not necessary to correct layout-designed exposure patterns themselves and hence the correction does not influence a circuit simulation that is performed by using the exposure patterns.

Further, where a drawing region is divided in mesh form, a region that is to be subjected to development for the correction processing is limited to a central mesh region and mesh regions surrounding it, that is, a calculation region for the correction is narrowed. As a result, the drawing data correction processing speed can further be increased.

BRIEF DESCRIPTION OF THE DRAWINGS

FIG. 3 is a functional block diagram of an exposure data correction apparatus according to the first embodiment;

DETAILED DESCRIPTION OF THE PREFERRED EMBODIMENTS

Embodiments of the present invention will be hereinafter described with reference to the drawings. In the following exposure data correction methods according to the embodiments, a correction is made on exposure data of exposure patterns that are layout-designed so that a transfer image close to desired design patterns is obtained.

Embodiment 1

Figure 1:
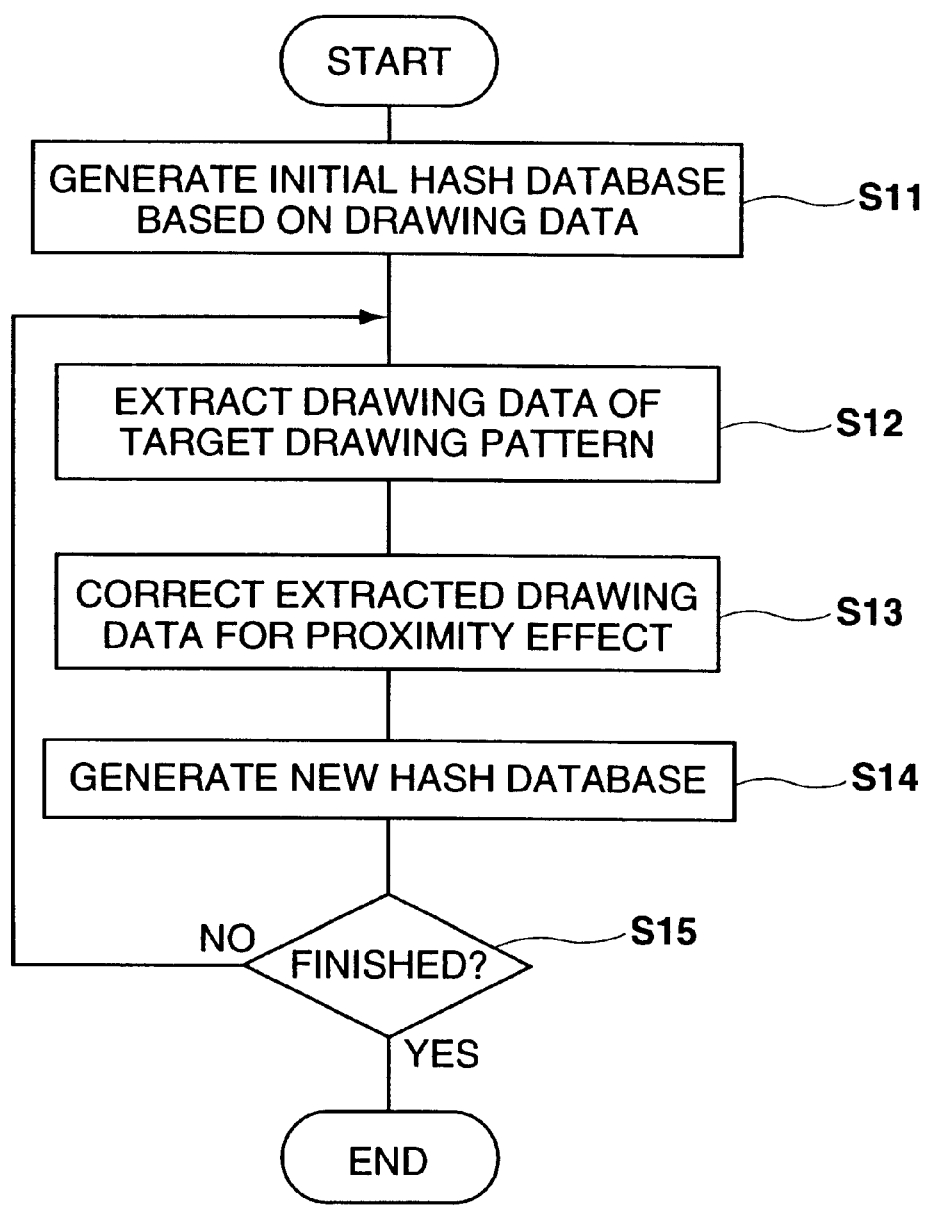
FIG. 1 is a flowchart of an exposure data correction method according to a first embodiment.
Figure 2B:
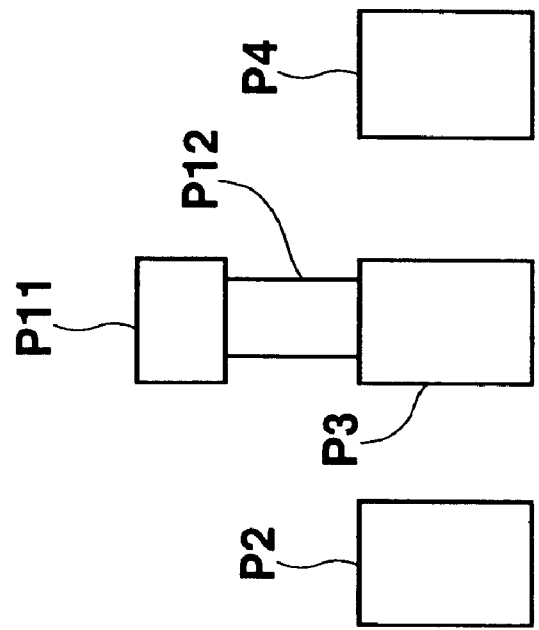
FIGS. 2A and 2B are pattern diagrams illustrating the exposure data correction method according to the first embodiment.
Figure 2A:
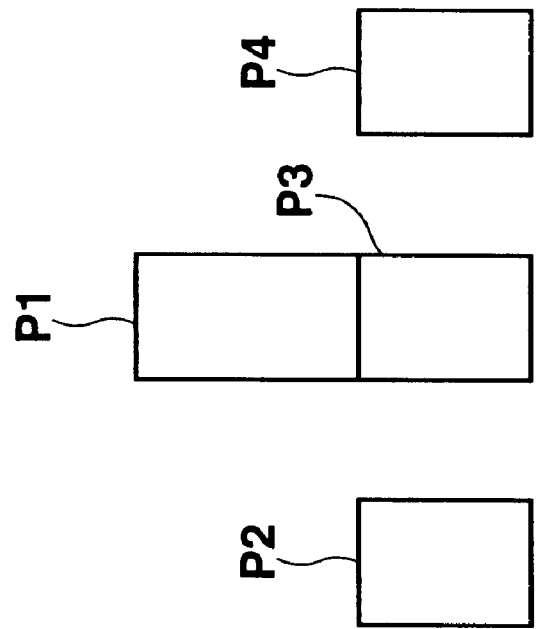

FIG. 1 is a flowchart showing an exposure data correction method according to an embodiment of the invention. FIGS. 2A and 2B are pattern diagrams illustrating the exposure data correction method according to the embodiment, and show states before and after a correction, respectively. The exposure data correction method according to the first embodiment will be described below with reference these drawings.

First, at step S11, a hash database is generated in which hash indices are given to drawing data of drawing patterns. The drawing patterns are ones for electron beam drawing that is obtained by performing pattern calculation processing on exposure data relating to layout-designed exposure patterns. The electron beam for the electron beam drawing may be either a Gaussian beam or a shaped beam. The above-mentioned drawing data is shape data relating to the above-mentioned drawing patterns, i.e., [width w, height h], and exposure amount data of an electron beam (energy beam as used in the claims), i.e., [dose d].

In this case, hash indices [ID] are given to [w, h, d] of the drawing data. Non-geometrical information such as an exposure amount is replaced by virtual geometrical information. Then, the following address table is generated which consists of address data [x, y] that indicate drawing positions of respective drawing patterns and hash indices [ID] as mentioned above:

| Address table: | | | (Drawing pattern) |
|---|---|---|---|
| X1 y1 | IDa | (p1) |
| X2 y2 | IDb | (p2) |
| X3 y3 | IDb | (p3) |
| X4 y4 | IDb | (p4) |

The following hash table is generated which consists of the above IDs and drawing data that are assigned the IDs:

| Hash table: | IDa | wa | ha | da |
|---|---|---|---|---|
| | IDb | wb | hb | db |

In the above manner, an initial hash database is generated which consists of the address table and the hash table.

Next, at step S12, drawing data [x1, y1, IDa] and [IDa, wa, ha, da] relating to one drawing pattern p1 are extracted by searching the hash database that was generated in the above step.

Then, at step S13, the above drawing data are corrected to prevent the proximity effect that will occur in exposure of a resist pattern on a wafer for formation of actual patterns. This correction is performed by using an automatic OPC system.

At this time, where the exposure for formation of actual patterns is direct drawing exposure with an electron beam, the above drawing data are corrected to correct for the electron beam proximity effect that will occur in this drawing exposure. The drawing data that are to be corrected at this time are the shape data of the drawing pattern and the exposure amount data of an electron beam. However, if only the shape data are to be corrected, hash indices may be given to only the shape data [w, h] at step S11.

On the other hand, where the exposure for formation of actual patterns is optical exposure with a photomask that is formed by electron beam lithography, the above drawing data are corrected to correct for the optical proximity effect that will occur in optical exposure with the photomask. In this case, the drawing data to be corrected are only the shape data and hence hash indices may be given to only the shape data [w, h] at step S1.

This embodiment is directed to the case of correcting for the proximity effect that will occur in optical exposure with a photomask, and the drawing pattern p1 is corrected to drawing patterns p11 and p12. As a result, the drawing data [wa, ha] of the drawing pattern p1 is corrected to shape data [wc, hc] of the drawing pattern p11 and shape data [we, he] of the drawing pattern p12.

Next, at step S14, hash indices are given to the corrected drawing data. The following new address table is generated which consists of address data [x, y] indicating drawing positions of the drawing patterns p11 and p12 and the above hash indices:

| Address table: | x11 y11 | IDe |
|---|---|---|
| | x12 y12 | IDd |

Further, the following new hash table is generated which consists of the above IDs and the drawing data that are given the Ids:

| Hash table: | IDd | wd hd dd |
|---|---|---|
| | IDe | we he de |

In the above manner, a new hash database is generated which consists of the address table and the hash table.

Next, at step S15, it is judged whether the drawing data of all drawing patterns have been corrected. If there remains a drawing pattern that has not been corrected, the process returns to step S12 to again execute steps S12–S14.

In the above steps, there may exist a drawing pattern whose drawing data after a correction is the same as before the correction. In giving hash indices to corrected drawing data, if the same drawing data exists in the new, already registered hash database, the corrected drawing data is registered only in the address table of the new hash database by citing the hash index given to the existing drawing data.

The following new hash database is thus generated:

| Address table: | x11 | y11 | IDe |
|---|---|---|---|
| | X12 | y12 | IDd |
| | X2 | y2 | IDb |
| | X3 | y3 | IDb |
| | X4 | y4 | IDb |
| Hash table: | IDb | wb hb db | |
| | IDd | wd hd dd | |
| | IDe | we he de | |

Then, it is judged at step S15 that the correction of all drawing patterns constituting the design patterns has completed, the above correction process is finished.

The above correction of exposure patterns is performed based on drawing data that are obtained by subjecting exposure data relating to layout-designed exposure patterns to pattern calculation processing to enable electron beam drawing. Since the drawing data have simple and a small number of pattern kinds, a hash database can easily be generated from the drawing data. By generating a hash database from the drawing data, drawing data of a target drawing pattern can be retrieved and corrected at high speed. Therefore, the processing time of correcting the exposure patterns for the proximity effect can be shortened, to make it possible to perform a chip-level correction with an automatic OPC system.

Further, in the above correction method, since a new hash database is generated based on corrected drawing data, the data amount of corrected exposure data can be kept in a compressed state.

Still further, since the above correction is performed on drawing data, it is not necessary to correct layout-designed exposure patterns themselves and hence the correction does not influence a circuit simulation that is performed by using the exposure patterns. Therefore, it becomes possible to perform a circuit simulation by using exposure patterns that are closer to actual patterns, improving the reliability of the circuit simulation.

FIG. 3 is a block diagram of a correction apparatus for practicing the above correction method. An embodiment of an exposure data correction apparatus will be hereinafter described with reference to FIG. 3.

As shown in FIG. 3, an exposure data correction apparatus 3 has an input means 301, an initial hash database generating means 302, a drawing data extracting means 303, a drawing data correcting means 304, and a new hash database generating means 305.

The input means 301 is not limited to any specific type: it suffices that the input means 301 allow input of drawing data of drawing patterns to be processed, as in the case of a keyboard, a touch panel, or the like. Where pattern data etc. that are stored in a recording medium such as a floppy disk are input, or drawing data are transferred and input from another data processing apparatus, a disk drive or the like is used as the input means 301.

For example, each of the initial hash database generating means 302, the drawing data extracting means 303, the drawing data correcting means 304, and the new hash database generating means 305 is implemented by an operation circuit or program information that is stored in a storing means such as a RAM, ROM, or an optical storage medium and processed by a CPU, for instance, of a computer.

The initial hash database generating means 302 is a means for executing step S11 of the above-described exposure data correction method. The drawing data extracting means 303 is a means for executing step S12 of the exposure data correction method. The drawing data correcting means 304 is a means for executing step S13 of the exposure data correction method, and is implemented by an automatic OPC system, for instance. The new hash database generating means 305 is a means for executing step S14 of the exposure data correction method.

As shown in FIG. 3, the exposure data correction apparatus may be provided with an output data generating means 306 and an output means 307. The output data generating means 306 is a means for generating output data to be used for performing electron beam drawing based on a new hash database that is generated by the new hash database generating means 305, and is program information or the like as in the case of the new hash database generating means 305 etc. The output means 307 is a means for outputting drawing data that is generated by the output data generating means 306, and serves to output drawing data to a drawing control means of an electron beam drawing apparatus (not shown), for instance.

The above-configured exposure data correction apparatus 3 can execute the above-described exposure data correction method according to the first embodiment.

Embodiment 2

Figure 4:
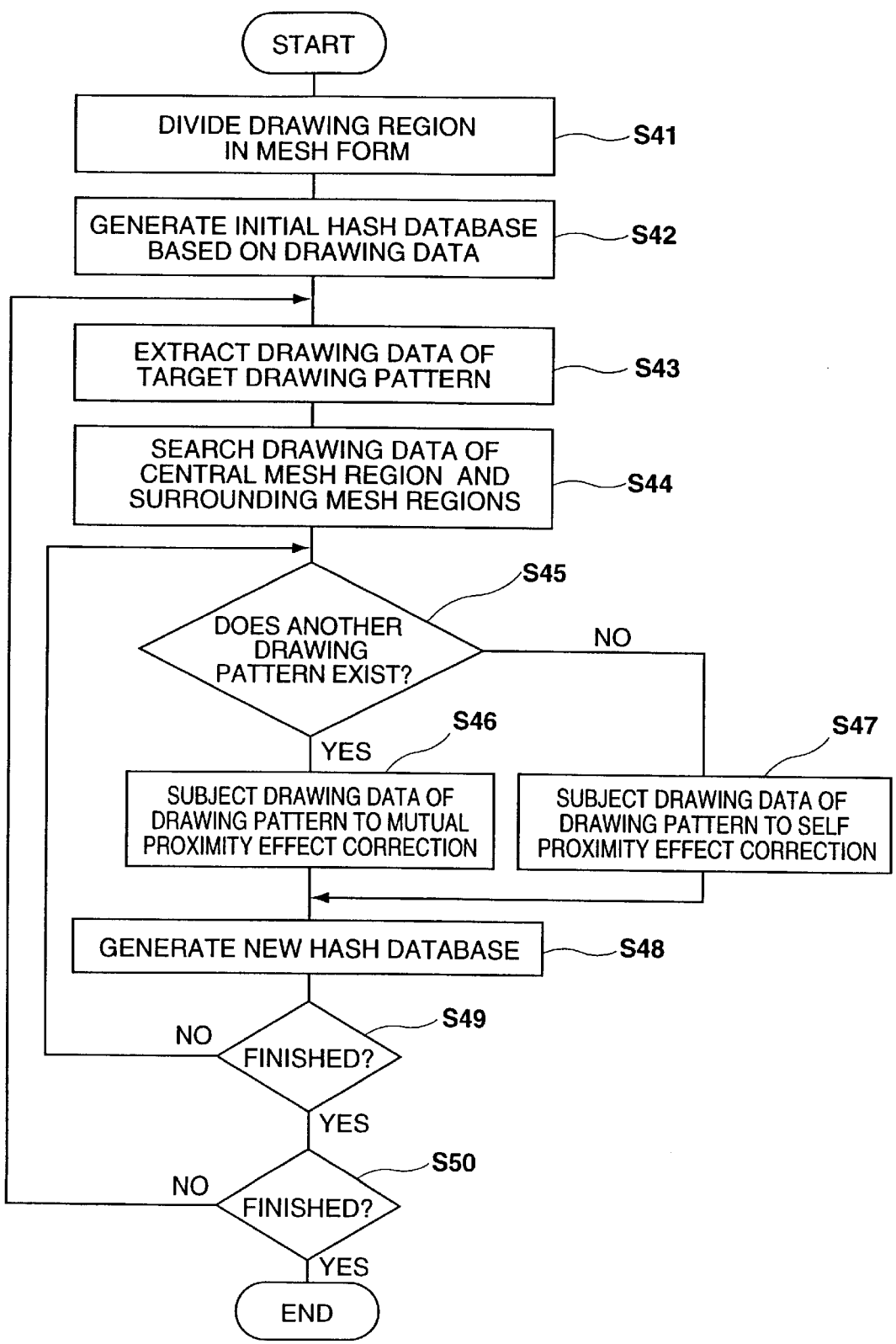
FIG. 4 is a flowchart of an exposure data correction method according to a second embodiment.
Figure 5:
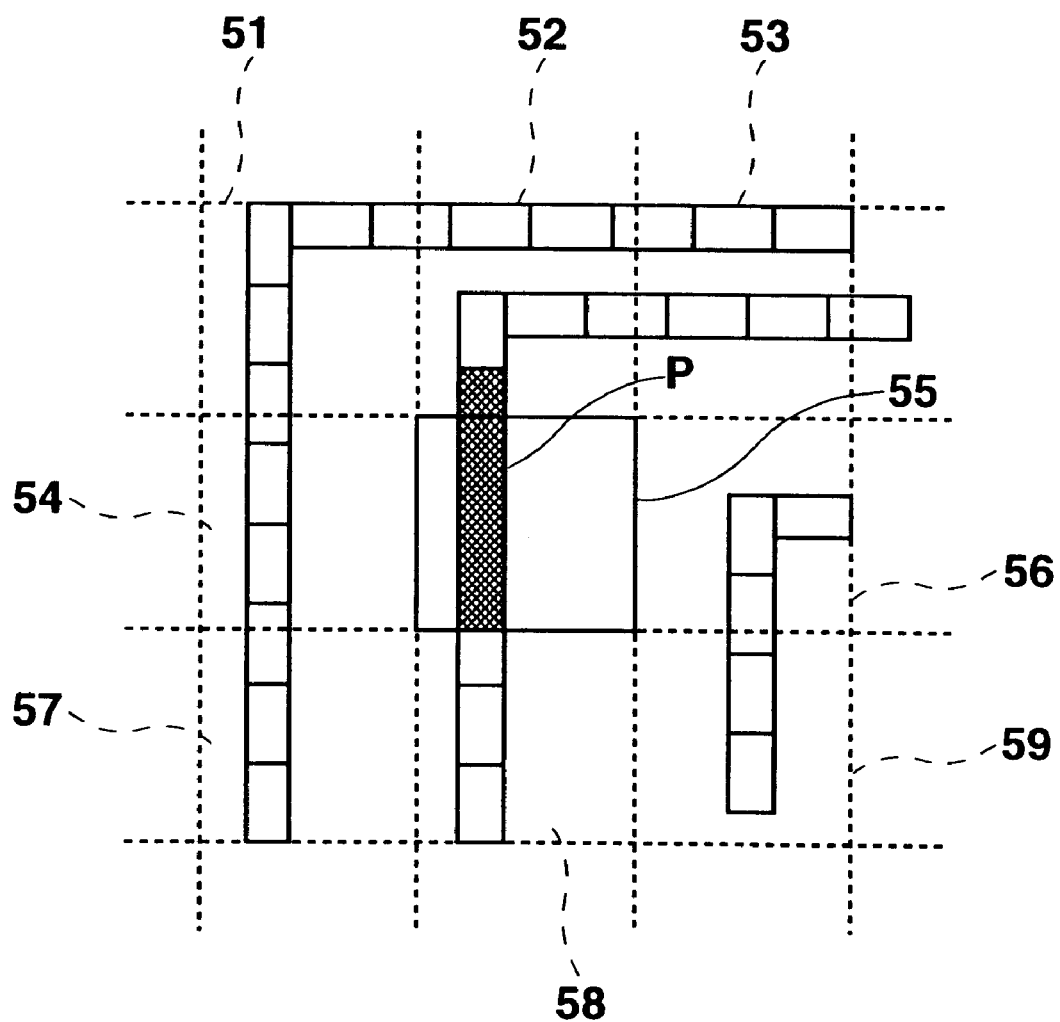
FIG. 5 is a pattern diagram illustrating mesh division in the second embodiment.

FIG. 4 is a flowchart showing an exposure data correction method according to a second embodiment of the invention. FIG. 5 is a pattern diagram illustrating the exposure data correction method according to the second embodiment. The exposure data correction method according to the second embodiment will be hereinafter described with reference to FIGS. 4 and 5.

First, at step S41, a drawing region is divided in mesh form based on drawing data similar to that in the first embodiment. The area of each of mesh regions 51, 52, . . . is determined so as to correspond to a scattering range of an electron beam used for exposure of an actual device. Where the exposure is direct drawing exposure with an electron beam, the area concerned is an electron beam scattering range in the drawing exposure. On the other hand, where the exposure is optical exposure with a photomask, the area concerned is determined so as to correspond to a scattering range of exposure light in the optical exposure. That is, let R represent the range of influence of the electron beam proximity effect or the optical proximity effect in exposure of an actual device; then, the drawing region of the electron beam drawing is divided in mesh form so that the area of each mesh region corresponds to an exposure region R×R. For example, in the case of exposure using an electron beam, the area of each mesh region is approximately 5 $\mu$m×5 $\mu$m to 10 $\mu$m×10 $\mu$m.

Next, at step S42, hash indices are given to part of the drawing data in each of the mesh regions 51, 52, . . . that have been produced by the mesh division of the drawing region. It is assumed that the drawing data are the same as in the first embodiment. Then, for example, the following address table is generated which consists of address data [X, Y] of the respective mesh regions, address data [x, y] indicating drawing positions of respective drawing patterns in each mesh region, and hash indices [ID]:

| Address table: | X1 Y1 | x1 y1 | IDa | (Mesh region 54) |
|---|---|---|---|---|
| | | x2 y2 | IDb | |
| | | x3 y3 | IDb | |
| | | x4 y4 | IDa | |
| | X2 Y2 | x4 y4 | IDa | (Mesh region 55) |
| | | x5 y5 | IDb | |
| | | x6 y6 | IDb | |
| | | x7 y7 | IDa | |
| | . . . | . . . | . . . | |

As in the case of the first embodiment, the following hash table is generated which consists of IDs and drawing data that are given the Ids.

| Hash table: | IDa | wa | ha | da |
|---|---|---|---|---|
| | IDb | wb | hb | db |
| | . . . | . . . | . . . | . . . |

In the above manner, an initial hash database is generated which consists of the address table and the hash table.

Next, at step S43, drawing data [x5, y5, IDb] and [IDb, wb, hb, db] relating to one drawing pattern (this is made a target drawing pattern) p is extracted by searching the hash database that was generated in the above step.

Thereafter, at step S44, the mesh region 55 where the target drawing pattern is located is set as a central mesh region 55 and drawing data in the central mesh region 55 and the eight surrounding mesh regions 51, 52, . . . that surrounds it are searched.

At step S45, it is judged based on results of the search whether drawing data other than the above-extracted drawing data of the target drawing pattern p exists in the nine mesh regions 51, 52, . . . .

If it is judged at step S45 that there exists other drawing pattern(s), the process goes to step S46, where the extracted drawing data of the target drawing pattern p is subjected to a mutual proximity effect correction. On the other hand, if it is judged at step S45 that there isn't any other drawing pattern, the process goes to step S47, where the extracted drawing data of the drawing pattern p is subjected to a self proximity effect correction. In these steps, the correction is performed by an automatic OPC system as in the case of the first embodiment.

Thereafter, step S48 is executed in the same manner as step S14 in the first embodiment, that is, a new hash database is generated by giving hash indices to or citing hash indices for corrected drawing data.

At the next step S49, it is judged whether the correction of all drawing patterns in the central mesh region 55 has completed. Steps S43–S48 are repeated until the correction of all drawing patterns in the central mesh region 55 is completed.

After the correction of all drawing patterns in the central mesh region 55 has completed, it is judged at step S50 whether the correction of the drawing patterns in all mesh regions 51, 52, . . . has completed. Steps S43–S49 are repeated until the correction of the drawing patterns in all mesh regions 51, 52, . . . is completed. A new hash database is thus generated based on drawing data that were obtained by performing the proximity effect correction on the original drawing data.

In the above exposure data correction method, the search range for the correction is limited by dividing a drawing region in mesh form so that each mesh region corresponds to a range of influence of the proximity effect in exposure. As a result, the region that is to be subjected to development and calculation for the correction processing can be reduced to a central mesh region and mesh regions surrounding it. Therefore, the correction processing speed can be made higher than in the correction method of the first embodiment.

Figure 6:
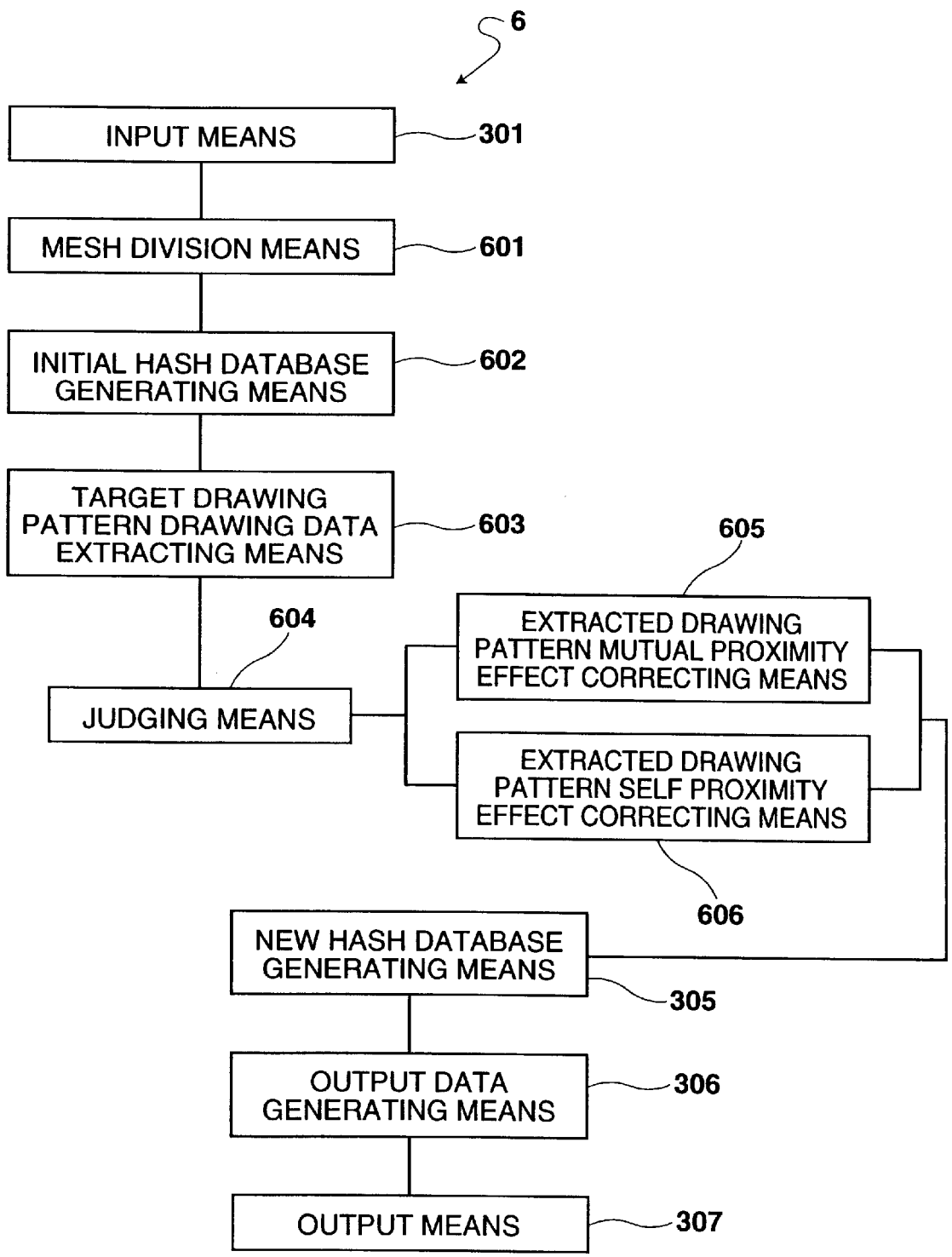
FIG. 6 is a functional block diagram of an exposure data correction apparatus according to the second embodiment.

FIG. 6 is a functional block diagram of a correction apparatus for practicing the above correction method. An embodiment of an exposure data correction apparatus will be hereinafter described with reference to FIG. 6.

The components that are the same as those of the exposure data correction apparatus described in the first embodiment will be described with the same reference numerals and given thereto.

As shown in FIG. 6, an exposure data correction apparatus 6 has an input means 301, a mesh division means 601, an initial hash database generating means 602, a drawing data extracting means 603, judging means 604, a mutual proximity effect correcting means 605, a self proximity effect correcting means 606, and a new hash database generating means 305.

The input means 301 is the same as that of the correction apparatus of the first embodiment. For example, each of the mesh division means 601, the initial hash database generating means 602, the drawing data extracting means 603, the judging means 604, the mutual proximity effect correcting means 605, the self proximity effect correcting means 606, and the new hash database generating means 305 is implemented by an operation circuit or program information that is stored in a storing means such as a RAM, ROM, or an optical storage medium and processed by a CPU, for instance, of a computer.

The mesh division means 601 is a means for executing step S41 in the above-described exposure data correction method. The initial hash database generating means 602 is a means for executing step S42. The drawing data extracting means 603 is a means for executing step S43. The judging means 604 is a means for executing steps S44 and S45. The mutual proximity effect correcting means 605 is a means for executing step S46 in the above-described exposure data correction method and the self proximity effect correcting means 606 is a means for executing step S47. For example, the correcting means 605 and 606 are implemented by an automatic OPC system. The new hash database generating means 305 is a means for executing step S48, and is the same as in the first embodiment. As shown in FIG. 6, there may be provided an output data generating means 306 and an output means 307 that are the same as those of the correction apparatus of the first embodiment.

The above-configured exposure data correction apparatus 6 can execute the exposure data correction method described in the second embodiment.

As described above, according to the invention, drawing data that is obtained by performing calculation processing on exposure data is corrected after a hash database is generated based on it. As a result, it becomes possible to retrieve and correct drawing data of a target drawing pattern at high speed, to thereby shorten the processing time of the proximity effect correction of the exposure data. Therefore, it becomes possible to improve the TAT of the correction processing, the mask designing, and the drawing data generation, and to apply an automatic OPC system to a chip-level exposure data correction. Further, by generating a new hash database based on corrected drawing data, the data amount of the corrected drawing data can be reduced (data compression). Further, by dividing a drawing region in mesh form, the region that is to be subjected to development for the correction processing can be limited, making it possible to further increase the drawing data correction processing speed. In addition, since the correction is performed on drawing data, the reliability of a circuit simulation which is performed by using layout-designed exposure patterns can be improved.

What is claimed is:

1. An exposure data correction method for correcting exposure data relating to layout-designed exposure patterns to correct for a proximity effect in exposure, comprising the steps of:

generating an initial hash database by giving hash indices to drawing data of drawing patterns that are obtained by performing calculation processing on the exposure data;

extracting drawing data of a target drawing pattern by searching the initial hash database;

correcting the drawing data of the target drawing pattern to prevent a proximity effect in exposure;

generating a new hash database by giving hash indices to the corrected drawing data;

said step of generating an initial hash database further comprising the substeps of:

dividing a drawing region in mesh form so that an area of each drawing region in mesh form corresponds to a scattering range of an energy beam that is used in the exposure; and generating the initial hash database by giving hash indices to drawing data of drawing patterns that are located in each of the mesh regions, and wherein the drawing data correcting step comprises the substeps of:

searching drawing data of a central mesh region where a target mesh region exists and surrounding mesh regions that surround the central mesh region, and judging whether a drawing pattern other than the target drawing pattern exists in the central mesh region or the surrounding regions;

performing a mutual proximity effect correction on the drawing data of the target drawing pattern if there exists another drawing pattern; and performing a self proximity effect correction on the drawing data of the target drawing pattern if there does not exist any other drawing pattern, wherein in the case where the drawing data correction is performed on a drawing pattern for direct drawing exposure of the exposure patterns, the drawing data is at least one of shape data of the drawing pattern and exposure amount data in the exposure, and in the case where the drawing data correction is performed on a drawing pattern for formation of a photomask for forming the exposure patterns, the drawing data is shape data of a drawing pattern for formation of the photomask.

2. An exposing data correction method for correcting exposure data relating to layout-designed exposure patterns to correct for a proximity effect in exposure, comprising the steps of:

generating an initial hash database by giving hash indices to drawing data of drawing patterns that are obtained by performing calculation processing on the exposure data;

extracting drawing data of a target drawing pattern by searching the initial hash database;

correcting the drawing data of the target drawing pattern to prevent a proximity effect in exposure;

generating a new hash database by giving hash indices to the corrected drawing data; wherein drawing exposure is performed by using drawing data that have been corrected by the exposure data correction method.

3. An exposing method wherein exposure is performed by using a photomask having patterns that have been formed by drawing exposure using drawing data that have been corrected by the exposure data correction method according to any one of claim 1.

4. A photomask comprising patterns that have been formed by drawing exposure using drawing data that have been corrected by the exposure data correction method according to any one of claim 1.

5. A semiconductor device manufactured through lithography processing by using a photomask having patterns that have been formed by drawing exposure using drawing data that have been corrected by the exposure data correction method according to any one of claim 1.

6. An exposure data correction apparatus for correcting exposure data relating to layout-designed exposure patterns to correct for a proximity effect in exposure, comprising:

means for generating an initial hash database by giving hash indices to drawing data of drawing patterns that are obtained by performing calculation processing on the exposure data;

means for extracting drawing data of a target drawing pattern by searching the initial hash database;

means for correcting the drawing data of the target drawing pattern to prevent a proximity effect in exposure;

means for generating a new hash database by giving hash indices to the corrected drawing data, wherein the initial hash database generating means comprises:

means for dividing a drawing region in mesh form so that an area of each of the drawing regions in mesh form corresponds to a scattering range of an energy beam that is used in the exposure; and means for generating the initial hash database by giving hash indices to drawing data of drawing patterns that are located in each of the mesh regions, and wherein the drawing data correcting means comprises:

means for searching drawing data of a central mesh region where a target mesh region exists and surrounding mesh regions that surround the central mesh region, and judging whether a drawing pattern other than the target drawing pattern exists in the central mesh region or the surrounding mesh regions;

means for performing a mutual proximity effect correction on the drawing data of the target drawing pattern if there exists another drawing pattern; and means for performing a self proximity effect correction on the drawing data of the target drawing pattern if there does not exist any other drawing pattern, wherein in the case where the drawing data correction is performed on a drawing pattern for direct drawing exposure of the exposure patterns, the drawing data is at least one of shape data of the drawing pattern and exposure amount data in the exposure, and in the case where the drawing data correction is performed on a drawing pattern for formation of a photomask for forming the exposure patterns, the drawing data is shape data of a drawing pattern for formation of the photomask.

7. An exposure data correction apparatus for correcting exposure data relating to layout-designed exposure patterns to correct for a proximity effect in exposure, comprising means for generating an initial hash database by giving hash indices to drawing data of drawing patterns that are obtained by performing calculation processing on the exposure data;

means for extracting drawing data of a target drawing pattern by searching the initial hash database;

means for correcting the drawing data of the target drawing pattern to prevent a proximity effect in exposure;

means for generating a new hash database by giving hash indices to the corrected drawing data; and exposing means for performing drawing exposure by using drawing data that have been corrected by the correction apparatus.

8. A manufacturing apparatus of a semiconductor device, comprising:

the exposure data correction apparatus according to any one of claim 6; and exposing means for performing exposure by using a photomask that has been formed by drawing exposure using drawing data that have been corrected by the correction apparatus.

* * * * *

UNITED STATES PATENT AND TRADEMARK OFFICE
CERTIFICATE OF CORRECTION

PATENT NO. : 6,144,760
DATED : November 7, 2000
INVENTOR(S) : Hidetoshi Ohnuma

It is certified that error appears in the above-identified patent and that said Letters Patent is hereby corrected as shown below:

<u>Column 12,</u>
Lines 23-30, should read
  7. An exposure data correction apparatus for correcting exposure data relating to layout-designed exposure patterns to correct for a proximity effect in exposure, comprising
means for generating an initial hash database by giving hash indices to drawing data of drawing patterns that are obtained by performing calculation processing on the exposure data;

Signed and Sealed this

Twenty-first Day of June, 2005

JON W. DUDAS
*Director of the United States Patent and Trademark Office*